United States Patent [19]
Ikeda et al.

[11] Patent Number: 5,517,402
[45] Date of Patent: May 14, 1996

[54] INVERTER CIRCUIT WITH AN IMPROVED INVERTER DRIVING CIRCUIT

[75] Inventors: Hideo Ikeda; Masao Oosawa, both of Isesaki; Masahiro Matsushima, Kiriu, all of Japan

[73] Assignee: Sanden Corporation, Isesaki, Japan

[21] Appl. No.: 70,766

[22] Filed: Jun. 3, 1993

[30] Foreign Application Priority Data

Jun. 4, 1992 [JP] Japan .................................. 4-168248
Jun. 11, 1992 [JP] Japan .................................. 4-175986

[51] Int. Cl.$^6$ .................................................. H02M 7/5387
[52] U.S. Cl. .................................................. 363/132; 363/98
[58] Field of Search .................................. 363/17, 98, 132

[56] References Cited

U.S. PATENT DOCUMENTS

| | | | |
|---|---|---|---|
| 3,976,932 | 8/1976 | Collins | 363/132 |
| 4,330,819 | 5/1982 | Foch et al. | 363/132 |
| 4,527,228 | 7/1985 | Chi Yu | 363/98 |
| 4,567,553 | 1/1986 | Foch et al. | 363/98 |
| 4,672,524 | 6/1987 | Toriyama et al. | 363/132 |
| 4,811,192 | 3/1989 | Egawa | 363/132 |
| 4,864,479 | 9/1989 | Steigerwald et al. | 363/17 |
| 4,937,470 | 6/1990 | Zeiler | 363/132 |
| 4,967,336 | 10/1990 | Davies et al. | 363/17 |
| 4,989,127 | 1/1991 | Wegener | 363/17 |
| 5,369,563 | 11/1994 | Miller | 363/17 |

*Primary Examiner*—Jeffrey L. Sterrett
*Attorney, Agent, or Firm*—Baker & Botts

[57] ABSTRACT

An inverter circuit including an inverter driving circuit and a plurality of pairs of switching elements coupled to a DC power source. The inverter driving circuit includes first and second gate driving circuits. The first gate driving circuit with a pulse transformer is coupled to a first switching element of each pair of switching elements, the latter of which is coupled to the positive side of the DC power source. The second gate driving circuit uses a non-induction control device, and is coupled to a second switching element of each pair of switching elements, the latter of which is coupled to the negative side of the DC power source. The total number of power sources required for the inverter driving circuit can be greatly decreased by using first gate driving circuits requiring no power source, as compared with that of a conventional inverter driving circuit constituted only by second gate driving circuits. A faster response speed for preventing damage to switching elements can be achieved by using second gate driving circuits having a fast response speed, as compared with that of a conventional inverter driving circuit constituted only by first gate driving circuits. Further, even if chopping is conducted, a high inverter efficiency can be obtained.

10 Claims, 8 Drawing Sheets

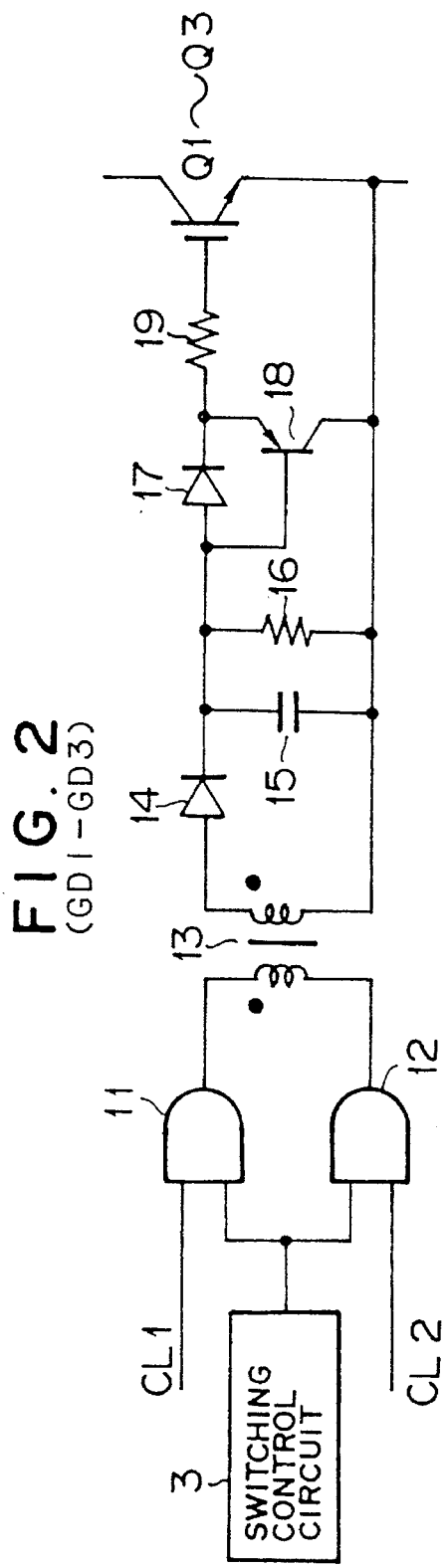
FIG. 2 (GD1–GD3)
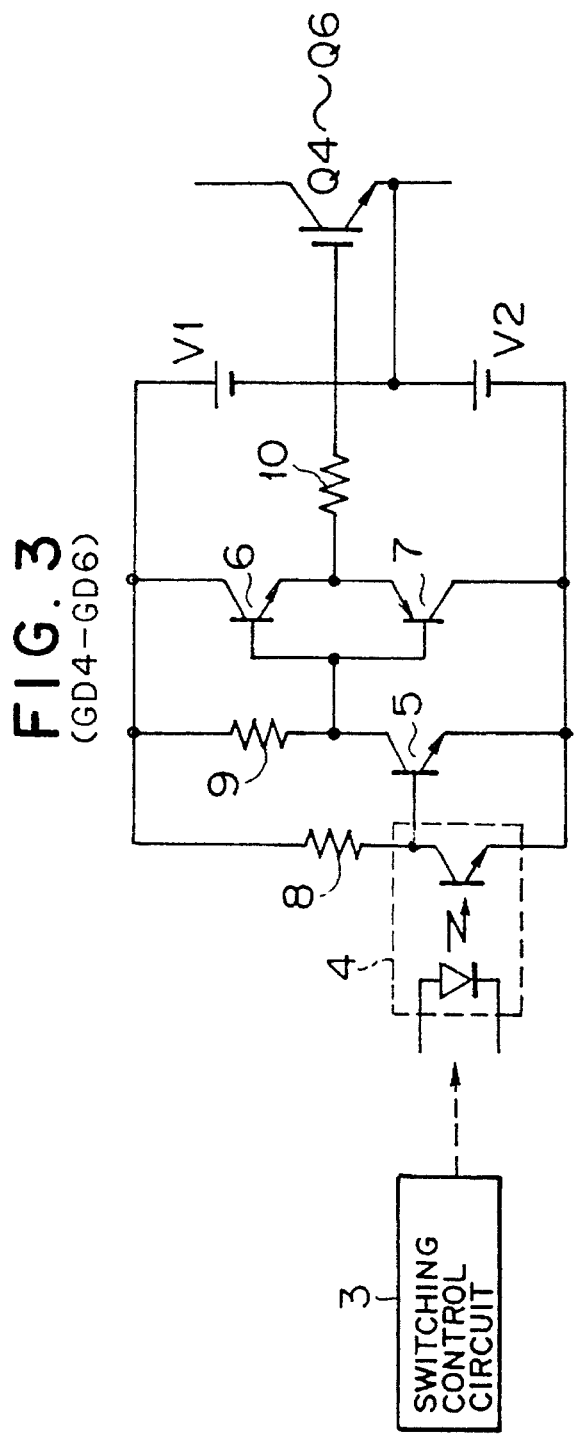
FIG. 3 (GD4–GD6)

(GD1–GD3 & GD1'–GD3')

(GD1–GD3 & GD1'–GD3')

INVERTER CIRCUIT WITH AN IMPROVED INVERTER DRIVING CIRCUIT

BACKGROUND OF THE INVENTION

1. Field of the Invention

The present invention relates to an inverter driving circuit for an inverter circuit including a plurality of pairs of switching elements for converting a direct current to an alternating current, and more particularly to a system of gate driving circuits for the switching elements.

2. Description of the Prior Art

Inverter circuits for converting a direct current to an alternating current by using a plurality of switching elements, which are utilized to drive an induction motor, a brushless motor or an uninterruptive power supply, are well known. A typical inverter circuit is shown, for example, in FIG. 12. In FIG. 12, a plurality (three in this example) of pairs of switching elements (Q), which are coupled in series to each other, are coupled to DC power source 1 in parallel to each other. Referring to FIGS. 13 and 14, gate driving circuits GD1—GD3 and GD1'—GD3' are coupled to switching elements Q1—Q6, respectively. Switching control circuit 3 is coupled to the respective gate driving circuits GD1—GD3 and GD1'—GD3+. Over current detecting circuit OC is coupled to switching control circuit 3. Output terminals of three-phase current (U, V, W) are connected to a three-phase load 2 such as a three-phase motor.

In such a conventional inverter circuit, gate driving circuits GD1—GD3 and GD1'—GD3' for switching elements Q1—Q6 all use a photocoupler (the details of this type gate driving circuit are described later with reference to FIG. 3) or a pulse transformer (the details of this type gate driving circuit are described later with reference to FIG. 2).

Conventional gate driving circuits for inverter circuits have a number of disadvantages. For example, a gate driving circuit such as shown in FIG. 3, which uses a photocoupler 4, requires two power sources V1 and V2. If such a gate driving circuit is employed for each of switching elements Q1-Q6, six power sources are required for switching elements Q1-Q3 coupled to the positive side of DC power source 1 and two power sources are required for switching elements Q4-Q6 coupled to the negative side of DC power source 1 (because a common emitter is used on this side). Consequently, the total number of power sources required is eight, which is an unacceptably high number for many reasons. On the other hand, a gate driving circuit such as shown in FIG. 2, which uses a pulse transformer 13, requires no additional power source. However, if this type of gate driving circuit is employed for each of switching elements Q1-Q6, the following disadvantages occur.

The latter type of gate driving circuit has poor switching response. In particular, the delay time in transmission of an off signal is relatively long. For example, in the circuit shown in FIG. 12, if a short occurs in load 2 (for example, a motor), an over current is detected by over current detecting circuit OC. Switching control circuit 3, which is responsive to over current detecting circuit OC, then turns off all switching elements Q1-Q6. However, because there is a relatively long delay time in transmission of an off signal, the switching elements often cannot be protected quickly enough.

Namely, there is a risk that one or more of the switching elements may be shorted.

Furthermore, the switching loss in the latter type of gate driving circuit (that is, a circuit using a pulse transformer) is large as compared with that in the gate driving circuit shown in FIG. 3 (that is, a circuit using a photocoupler), because the switching speed thereof is faster than that of the gate driving circuit shown in FIG. 3. Therefore, when the control signal sent to the gate driving circuit is chopped to change the rotational speed of a motor provided as load 2, if the chopping is conducted at a high frequency, the inverter efficiency is greatly reduced.

SUMMARY OF THE INVENTION

Accordingly, an object of the present invention is to provide an inverter driving circuit which can greatly decrease the number of required power sources, and can prevent damage to switching elements due to a short of a load.

Another object of the present invention is to provide an inverter driving circuit which can obtain a high inverter efficiency even if chopping is conducted to change the rotational speed of a motor provided as a load.

To achieve these and other objects, an inverter driving circuit according to the present invention is employed in an inverter circuit wherein a plurality of pairs of switching elements, which are coupled in series to each other, are coupled to a DC power source in parallel to each other for converting a direct current to an alternating current. The inverter driving circuit includes a first gate driving circuit, a second gate driving circuit and a switching control circuit generating control signals for the first and second gate driving circuits. The first gate driving circuit includes a pulse transformer. The first gate driving circuit is coupled to one of the switching elements (i.e., the first switching element) of each pair of switching elements. The first switching elements are coupled to the positive side of the DC power source. The second gate driving circuit does not have a pulse transformer, and has another device for controlling a gate driving signal such as a photocoupler. The second gate driving circuit is coupled to each of the second switching element of each pair of switching elements. The second switching elements are coupled to the negative side of the DC power source.

Another inverter driving circuit according to the present invention further includes a chopping circuit coupled only between the second gate driving circuit and the switching control circuit for chopping the control signal generated by the switching control circuit for the second gate driving circuit and sent from the switching control circuit to the second gate driving circuit.

In the inverter driving circuit according to the present invention, since the first gate driving circuit with a pulse transformer is employed for each of the first switching elements coupled to the positive side of the DC power source, no power source is required in this portion of the inverter driving circuit. In the portion using the second gate driving circuit without a pulse transformer (for example, a gate driving circuit with a photocoupler) employed for each of the second switching elements coupled to the negative side of the DC power source, basically two power sources are required. Therefore, the total number of the power sources required for the inverter driving circuit can be limited to two. Thus, the total number of power sources required can be greatly decreased, as compared with that of a conventional inverter driving circuit.

Further, in each pair of switching elements, a first switching element coupled to the positive side of the DC power source and a second switching element coupled to the negative side of the DC power source are coupled in series to each other. Since the second switching element is driven by the second gate driving circuit without a pulse transformer, the second switching element is turned off very quickly. As a result, the circuit formed by the pairs of switching elements can be turned off very quickly, and damage to the switching elements can be prevented even if a short occurs in a load.

Furthermore, in the second embodiment of the present invention in which a chopping circuit is provided only between the second gate driving circuit and the switching control circuit, since the second gate driving circuit does not include a pulse transformer, only a very small energy is required for switching a gate driving signal thereby reducing switching loss. Therefore, even if chopping is performed at a high frequency for changing the rotational speed of a motor, a high inverter efficiency can be achieved.

Preferred exemplary embodiments of the invention are described with reference to the accompanying drawings which are given by way of example only, and are not intended to limit the present invention.

BRIEF DESCRIPTION OF THE DRAWINGS

FIG. 2 is a circuit diagram of a gate driving circuit forming gate driving circuits GD1–GD3 of the circuit shown in FIG. 1.

FIG. 3 is a circuit diagram of a gate driving circuit forming gate driving circuits GD4–GD6 of the circuit shown in FIG. 1.

DETAILED DESCRIPTION OF THE PREFERRED EMBODIMENTS OF THE INVENTION

Figure 1:
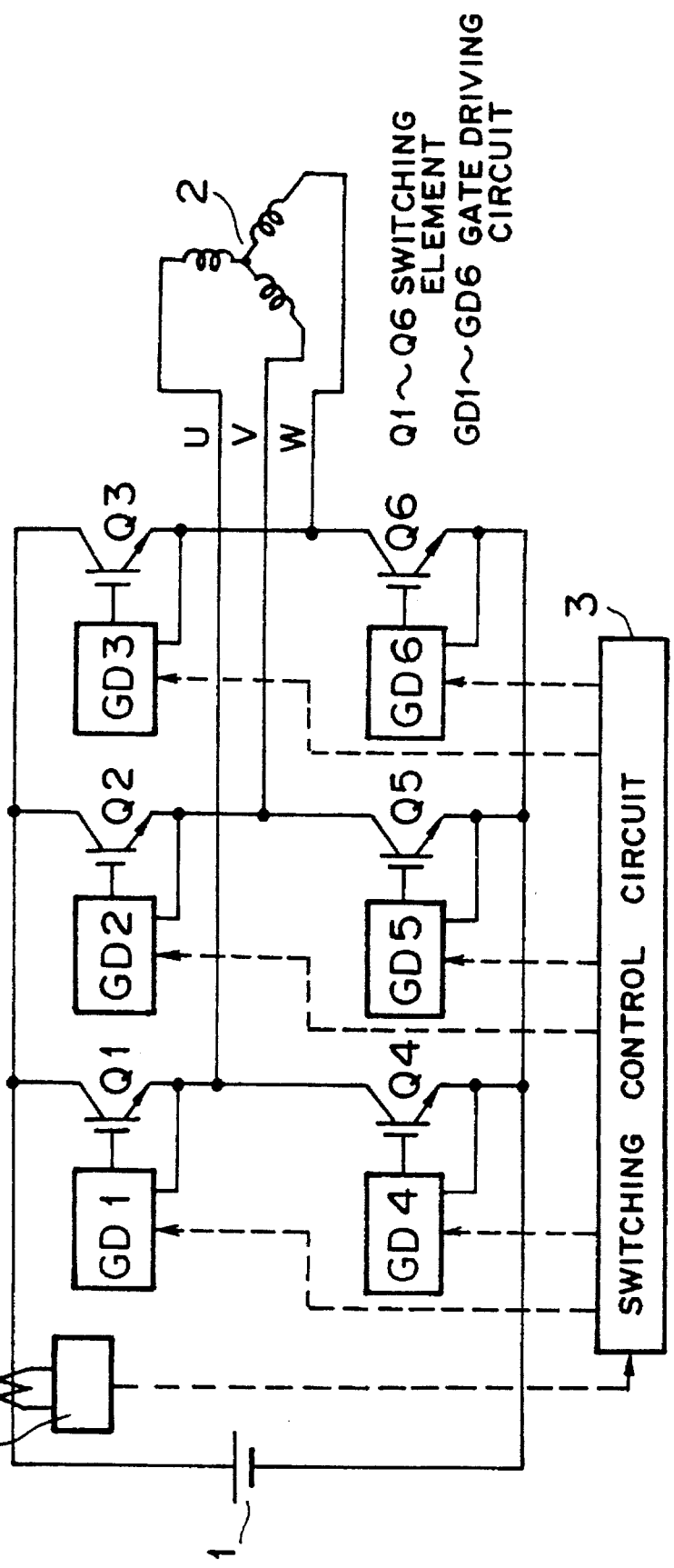
FIG. 1 is a circuit diagram of an inverter driving circuit according to a first preferred embodiment of the present invention.

Referring to the drawings, FIG. 1 illustrates an inverter circuit including an inverter driving circuit according to a first preferred embodiment. The inverter circuit includes a DC power source 1, a switching control circuit 3 and an over current detecting circuit OC. Over current detecting circuit OC is coupled to switching control circuit 3. Three-phase output terminals (U, V, W) of the inverter circuit are coupled to a brushless motor 2 which provides a three-phase load. However, it should be noted that, although the inverter circuit shown in FIG. 1 is a three-phase inverter circuit, the present invention can be applied to a single-phase inverter circuit.

A pair of switching elements Q1 and Q4 are coupled in series to each other. Similarly, a pair of switching elements Q2 and Q5 are coupled in series to each other and a pair of switching elements Q3 and Q6 are coupled in series to each other. The three sets of switching elements Q1 and Q4, Q2 and Q5 and Q3 and Q6 are coupled to DC power source 1 in parallel to each other, respectively. Switching elements Q1–Q3 are coupled to the positive side of DC power source 1. Switching elements Q4–Q6 are coupled to the negative side of DC power source 1. Respective gate driving circuits GD1–GD6 are coupled to respective switching elements Q1–Q6. Switching control circuit 3 is coupled to respective gate driving circuits GD1–GD6. Each switching element is switched on or off by each corresponding gate driving circuit in response to a signal sent from switching control circuit 3. In this embodiment, an insulated gate bipolar type transistor is employed as each switching element. In this inverter circuit, the direct current of DC power source 1 is converted to a three-phase alternating current by six switching elements Q1–Q6, and three-phase motor 2 is driven by the converted three-phase alternating current.

Gate driving circuits GD1–GD3 for switching elements Q1–Q3, which are coupled to the positive side of DC power source 1, are constructed from a gate driving circuit shown in FIG. 2. The gate driving circuit uses a pulse transformer 13. In this gate driving circuit, clock signals CL1 and CL2, which have the same frequency but different, reversed phases, are always supplied to one of the input terminals of AND gates 11 and 12.

When switching element Q1 (Q2, Q3) is about to be turned on, a high level signal sent from switching control circuit 3 is input to the other terminals of AND circuits 11 and 12 which are coupled to each other. Clock signals CL1 and CL2 are sent to the primary side of pulse transformer 13, and induced power is generated in the secondary side of the pulse transformer 13 as an alternating pulse. This alternating pulse is rectified and leveled by diode 14 and capacitor 15 to provide a DC voltage. The DC voltage turns on switching element Q1 (Q2, Q3) via diode 17 and resistance 19.

When switching element Q1 (Q2, Q3) is about to be turned off, a low level signal sent from switching control circuit 3 is input to AND circuits 11 and 12. The output signals of AND gates 11 and 12 both become low level, and pulse transformer 13 turns off. Therefore, electric charge in capacitor 15 is discharged through resistance 16. Since diode 17 is coupled to the base of transistor 18, the electric potential of the base becomes lower than that of the emitter of the transistor 18 and a base current flows to turn on transistor 18. When transistor 18 is turned on, the electric charge stored in the gate of switching element Q1 (Q2, Q3) flows out through resistance 19 and transistor 18, which turns off the switching element.

In this "off" operation of the switching element, the delay time in transmission of an off signal (time since switching control circuit 3 is turned off until the switching element is turned off) is longer than that of the circuit using a photocoupler described below in connection with FIG. 3, because the discharge of capacitor 15 requires a certain time. However, since not only on-off control signal but also electric power can be transmitted in this type gate driving circuit using a pulse transformer 13, no power source for driving a switching element is required.

Gate driving circuits GD4–GD6 for switching elements Q4–Q6, which are coupled to the negative side of DC power source 1, are constructed from a gate driving circuit which does not use a pulse transformer, such as illustrated by the gate driving circuit shown in FIG. 3. The gate driving circuit shown in FIG. 3 uses a non-induction control device such as a photocoupler 4.

When switching element Q4 (Q5, Q6) is about to be turned on, photocoupler 4 is turned on in response to a signal sent from switching control circuit 3 to thereby turn on transistor 5. Further, transistor 6 is turned on and transistor 7 is turned off. A current flows from forward bias power source V1 through transistor 6 and resistance 10, and switching element Q4 (Q5, Q6) is turned on.

When switching element Q4 (Q5, Q6) is about to be turned off, photocoupler 4 is turned off in response to a signal sent from switching control circuit 3 to thereby turn off transistor 5. Further, transistor 6 is turned off and transistor 7 is turned on. A reverse bias current flows from reverse bias power source V2 through resistance 10 and transistor 7. The electric charge stored in the gate of the switching element during the "on" condition is rapidly extracted, and thus the switching element is quickly turned off.

In the above type gate driving circuit using a photocoupler, two power sources are required for driving a switching element.

However, since the delay time in transmission of an off signal in photocoupler 4 is very short, the elapsed period of time from turn off of switching control circuit 3 to turn off of the switching element is much shorter than that of the aforementioned gate driving circuit using a pulse transformer.

Thus, in the inverter driving circuit of the first embodiment, no power source is required for gate driving circuits GD1–GD3 for switching elements Q1–Q3 coupled to the positive side of DC power source 1, and two power sources are required for gate driving circuits GD4–GD6 for switching elements Q4–Q6 coupled to the negative side of the DC power source 1 because common emitter transistors are used. Namely, the total number of power sources in this inverter driving circuit can be limited to two. Therefore, the total number of power sources can be greatly decreased as compared with a conventional inverter driving circuit constituted only by gate driving circuits each requiring a power source. Additionally, the inverter driving circuit can be small-sized and simplified by the smaller number of power sources.

Further, since respective ones of switching elements Q1, Q2 and Q3 are coupled in series to respective ones of switching elements Q4, Q5 and Q6, if any one pair of switching elements Q1 and Q4, Q2 and Q5 or Q3 and Q6 is turned off, the inverter driving circuit of the pair of switching elements can be turned off. Since switching elements Q4–Q6 are driven by gate driving circuits GD4–GD6 using photocoupler 4 having a very short delay time in transmission of an off signal, the switching elements Q4–Q6 can be turned off very quickly. Therefore, even if a short occurs in motor 2, all the switching elements can be properly protected by a quick turn off operation thereby preventing damage.

Although a gate driving circuit using photocoupler 4 is employed in gate driving circuits GD4–GD6 in the above embodiment, another gate driving circuit which does not use a photocoupler can be employed as a gate driving circuit without using a pulse transformer. Such a gate driving circuit can be constructed in a case where insulation is not required.

Figure 4:
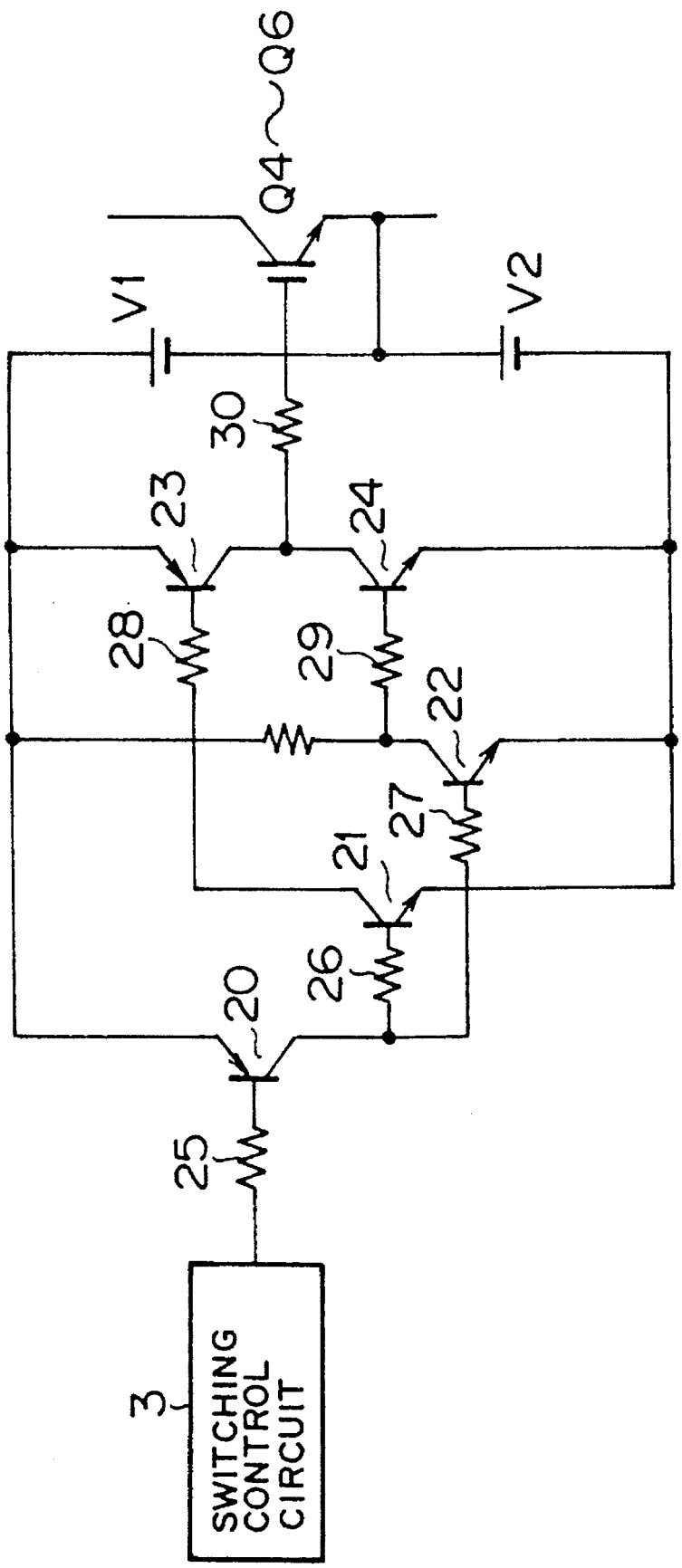
FIG. 4 is a circuit diagram of another gate driving circuit employed as gate driving circuits GD4–GD6 in the circuit shown in FIG. 1.

For example, FIG. 4 illustrates a gate driving circuit in which a signal from switching control circuit 3 is sent directly to transistor 20 via resistance 25. In the "on" operation of switching elements Q4–Q6, when the output of switching control circuit 3 is low, transistor 20 is turned on, which turns on transistors 21 and 22. Then, transistor 23 is turned on and transistor 24 is turned off. Thus, switching element Q4 (Q5, Q6) is turned on. In FIG. 4, numerals 26, 27, 28, 29 and 28 indicate various resistances, V1 indicates a forward bias power source and V2 indicates a reverse bias power source, respectively.

In the "off" operation of switching elements Q4–Q6, when the output of switching control circuit 3 is high, transistor 20 is turned off, which turns off transistors 21 and 22. Then, transistor 23 is turned off and transistor 24 is turned on. The electric charge stored in the gate of the switching element flows out through resistance 30, which rapidly turns off transistor 24 and the switching element.

Figure 5:
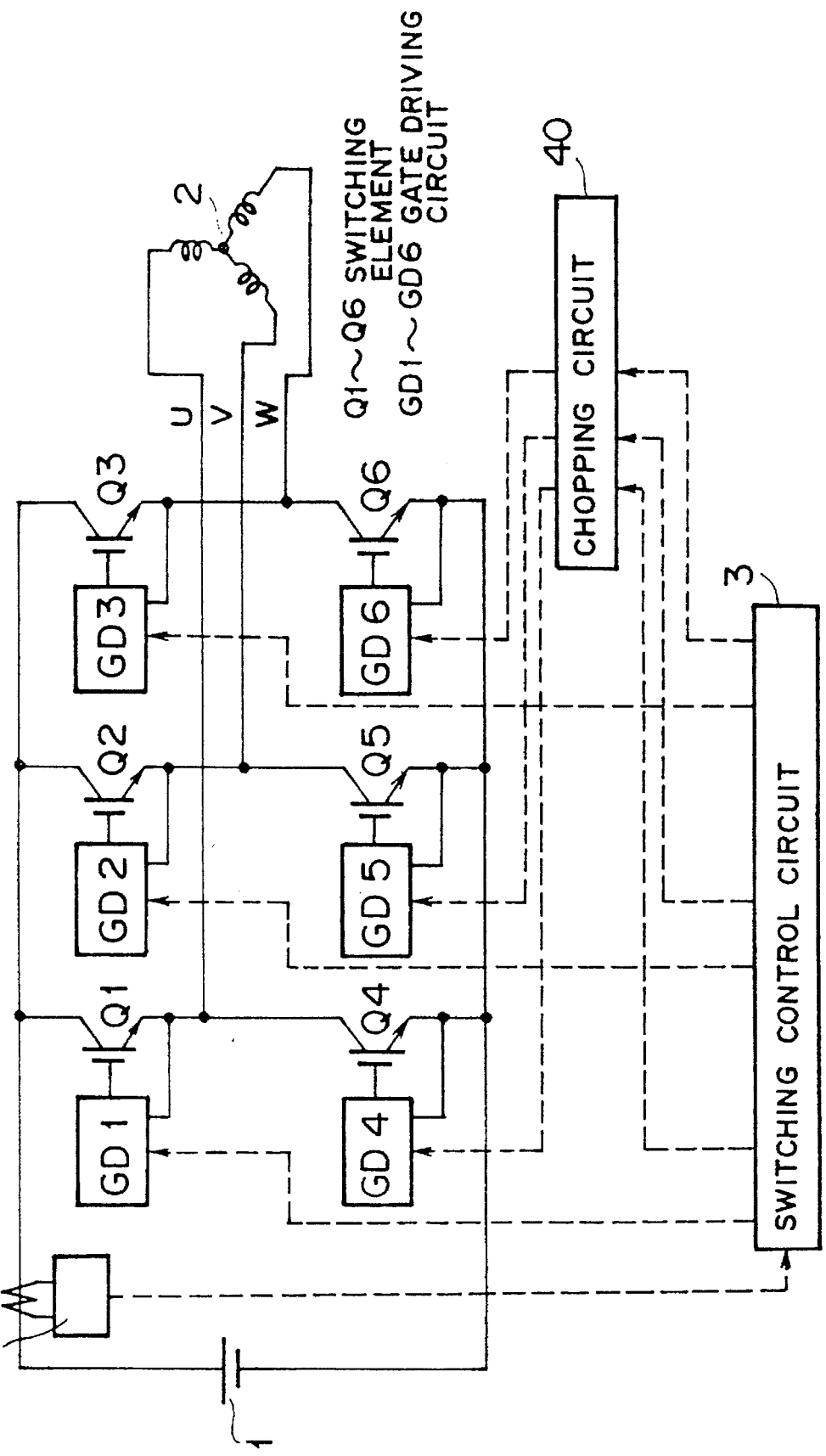
FIG. 5 is a circuit diagram of an inverter driving circuit according to a second preferred embodiment of the present invention.

FIG. 5 illustrates a circuit of an inverter circuit including an inverter driving circuit according to a second preferred embodiment. In this inverter driving circuit, a chopping circuit 40 is added. Other circuit portions are basically the same as those in the circuit shown in FIG. 1. Chopping circuit 40 is coupled only between gate driving circuits GD4–GD6 for switching elements Q4–Q6 and switching control circuit 3 for chopping the control signal sent from switching control circuit 3 to gate driving circuits GD4–GD6. A known chopping circuit can be used as chopping circuit 40.

Figure 6:
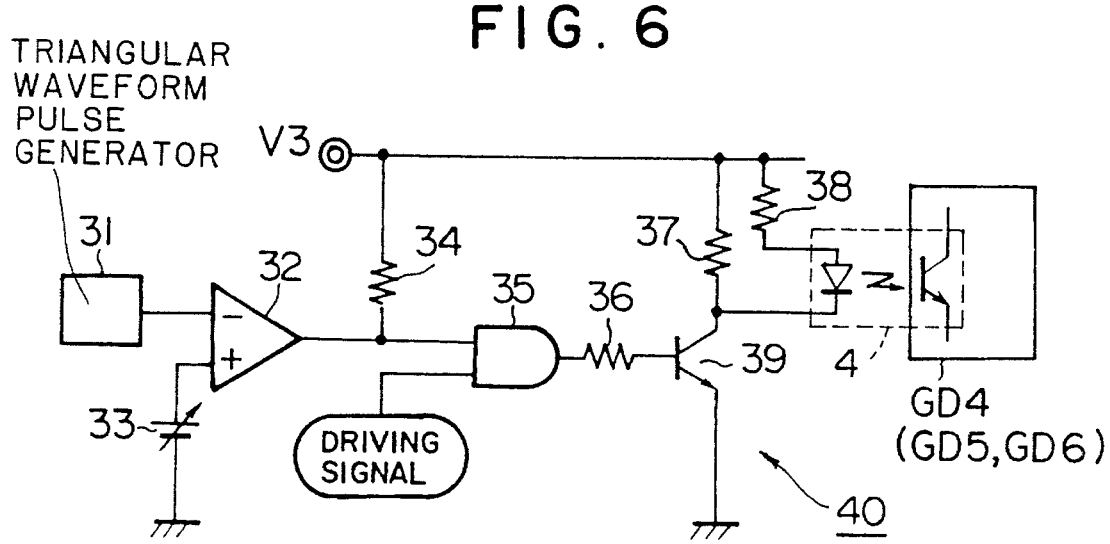
FIG. 6 is a circuit diagram of a chopping circuit used in the circuit shown in FIG. 5.

FIG. 6 illustrates chopping circuit 40 for chopping the output signals of switching elements Q4–Q6 driven by gate driving circuits GD4–GD6 in order to chop the output signals of the inverter circuit shown in FIG. 5. Chopping circuit 40 includes pulse generator 31, a comparator 32, a variable power source 33, resistances 34, 36, 37 and 38, an AND gate 35, a transistor 39 and a power source V3.

Figure 7:
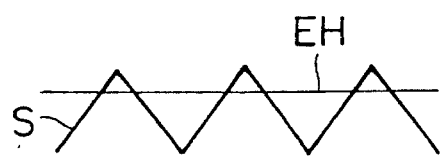
FIG. 7 is a waveform diagram of a signal input to a comparator in the chopping circuit shown in FIG. 6 illustrating a first condition.
Figure 8:
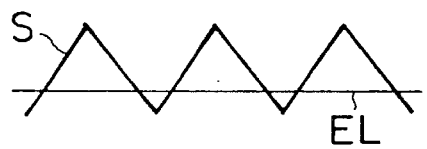
FIG. 8 is a waveform diagram of a signal input to a comparator in the chopping circuit shown in FIG. 6 illustrating a second condition.
Figure 9:
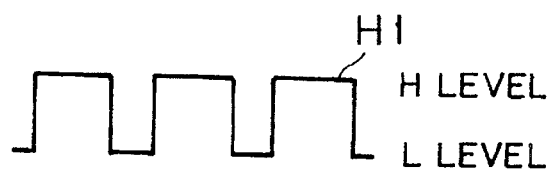
FIG. 9 is a waveform diagram of an output signal of the comparator shown in FIG. 6 when a signal is input to the comparator like the waveform shown in FIG. 7.
Figure 10:
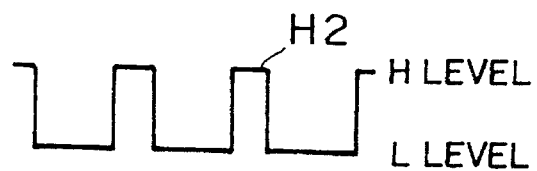
FIG. 10 is a waveform diagram of an output signal of the comparator shown in FIG. 6 when a signal is input to the comparator like the waveform shown in FIG. 8.

In chopping circuit 40, a triangular pulse of, for example, 10 kHz from pulse generator 31 is input to the negative side of comparator 32. The duty factor of the output signal of comparator 32 changes by changing the voltage of variable power source 33, as shown in FIGS. 9 and 10. Namely, when a voltage signal EH with a high level relative to triangular pulse "S" from pulse generator 31 is input from variable power source 33 to comparator 32 as shown in FIG. 7, a duty factor of output signal H1 as shown in FIG. 9 can be obtained. When a voltage signal EL with a low level relative to triangular pulse "S" from pulse generator 31 is input from variable power source 33 to comparator 32 as shown in FIG. 8, a duty factor of output signal H2 as shown in FIG. 10 can be obtained.

An output signal from comparator 32 of the above type is input to one input terminal of AND gate 35. The other input terminal of AND gate 35 receives a driving signal from switching control circuit 3 which may have a phase angle of 120 degrees. When the output signal of AND gate 35 is in a high level (H level), transistor 39 turns on. A voltage is applied to photocoupler 4 when transistor 39 turns on, which turns on photocoupler 4. Therefore, switching elements Q4–Q6 are turned on by the operation of gate driving circuits GD4–GD6 as aforementioned. When the output signal of AND gate 35 is in a low level (L level), transistor 39 turns off. A voltage is not applied to photocoupler 4, and the photocoupler 4 turns off. Therefore, switching elements Q4–Q6 are turned off by the operation of gate driving circuits GD4–GD6 as aforementioned. The output signal of AND gate 35 is a chopped signal with a certain duty factor as described above. Therefore, the on-off signals for switching elements Q4–Q6 also become chopped signals.

Figure 11:
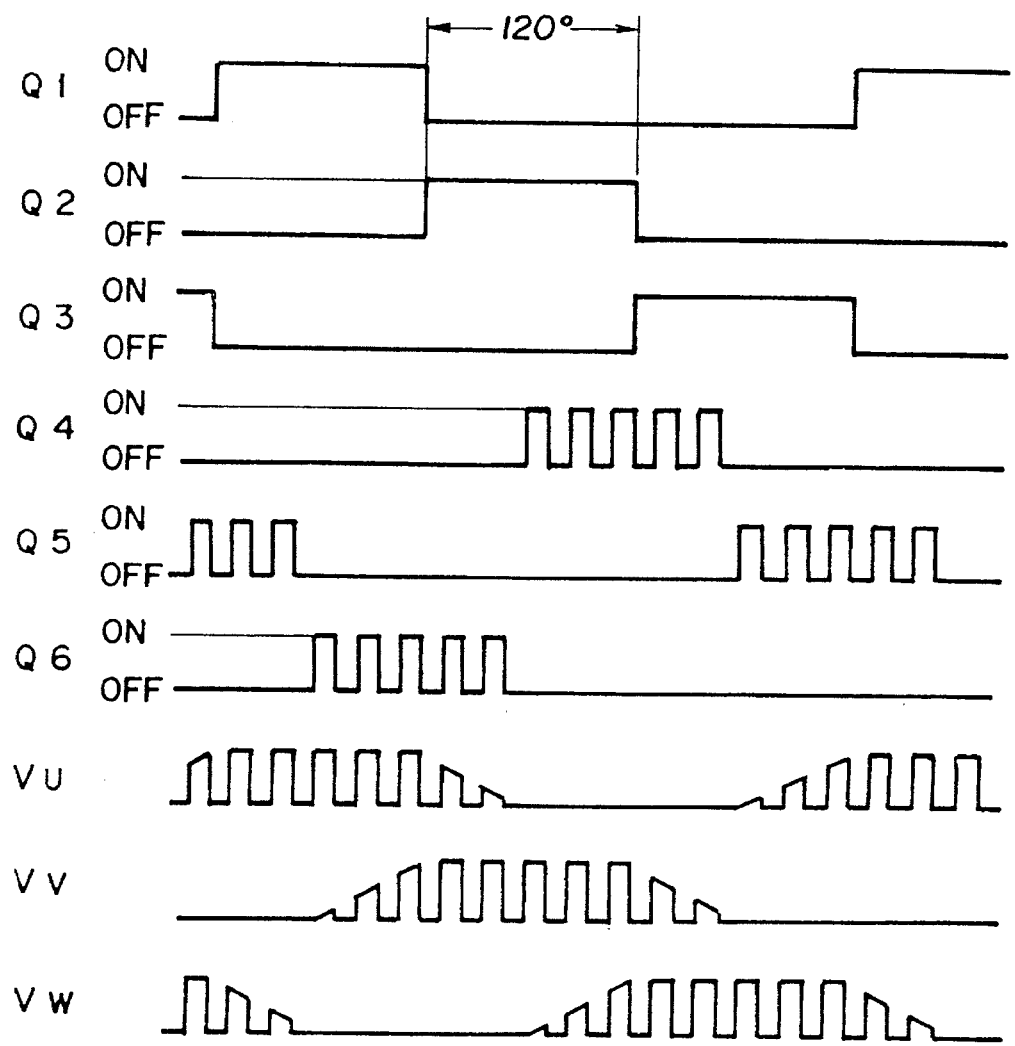
FIG. 11 is a waveform diagram of signals at various portions of the circuit shown in FIG. 5 illustrating the effect of chopping.
Figure 12:
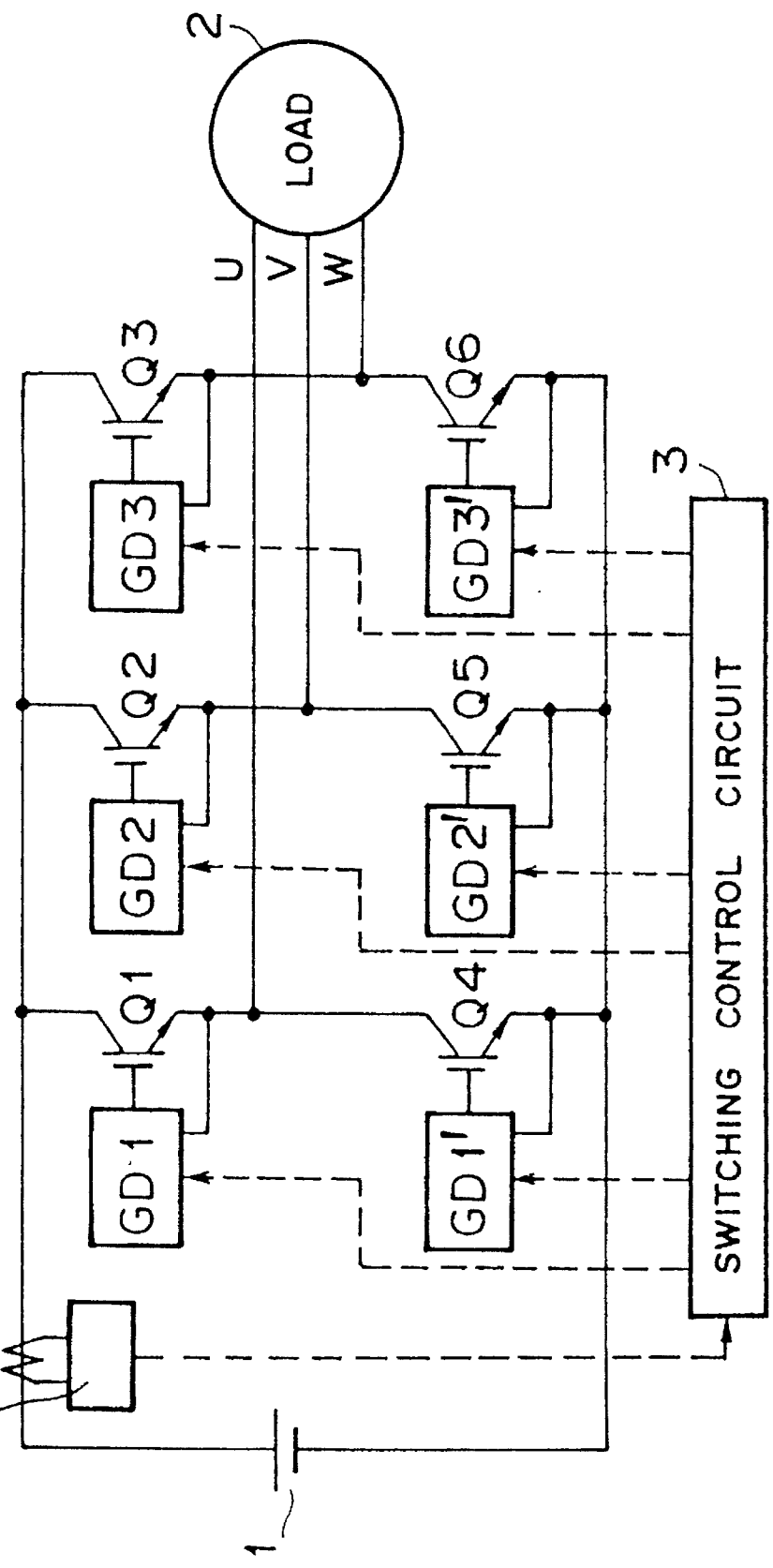
FIG. 12 is a circuit diagram of a conventional inverter driving circuit.
Figure 13:
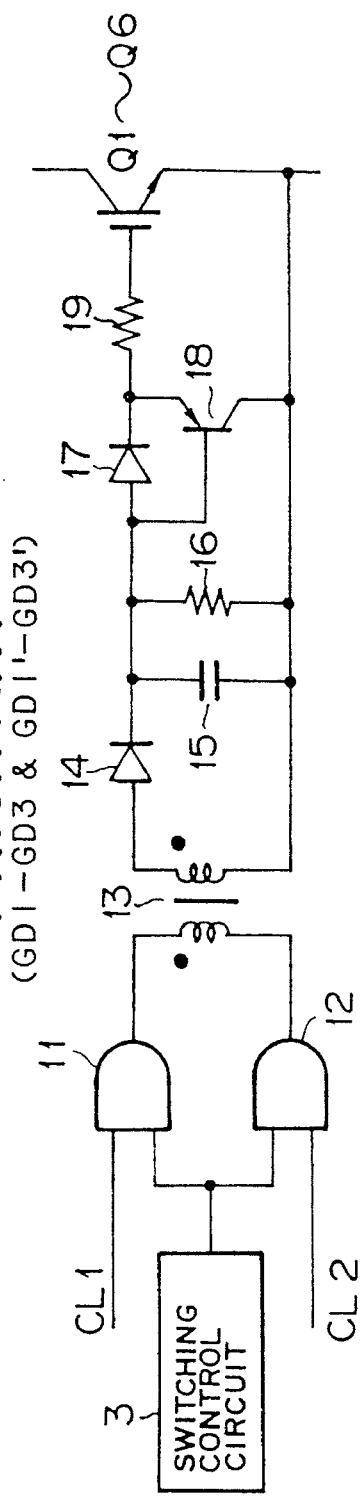
FIG. 13 is a circuit diagram of a gate driving circuit forming gate driving circuits GD1–GD3 and GD'–GD3' of the conventional inverter driving circuit shown in FIG. 12.
Figure 14:
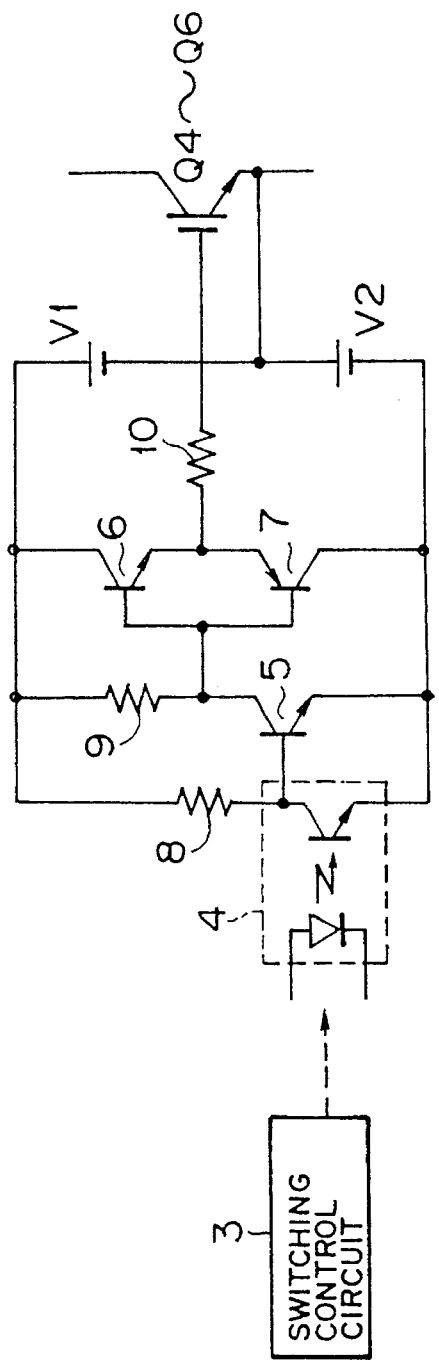
FIG. 14 is another circuit diagram of a gate driving circuit forming gate driving circuits GD1–GD3 and GD1'–GD3' of the conventional inverter driving circuit shown in FIG. 12.

FIG. 11 illustrates an operational relationship among switching elements Q1–Q6 when motor 2 is driven. Although switching elements Q1–Q3 on the positive side of power source 1 are turned on or off in 120 degree phases, switching elements Q4–Q6 on the negative side are respectively turned on-off (that is, chopped) at a certain duty factor during an "on" condition of 120 degrees. As a result, respective voltages Vu, Vv and Vw of three phase terminals (U, V, W) are chopped as shown in FIG. 11. Thus, the rotational speed of motor 2 can be changed by chopping only switching elements Q4–Q6 on the negative side of power source 1.

Since chopping circuit 40 is coupled only to gate driving circuits GD4–GD6 for switching elements Q4–Q6 on the negative side of power source 1 and the gate driving circuits GD4–GD6 do not use a pulse transformer thereby having less energy loss, the switching loss in the inverter driving circuit can be significantly reduced. Therefore, even if chopping is performed to change the rotational speed of motor 2, a high inverter efficiency can be achieved.

Although several preferred embodiments have been described, it will be appreciated by those skilled in the art that various modifications and alterations can be made to these embodiments without materially departing from the novel teachings and advantages of this invention. Accordingly, it is to be understood that all such modifications and alterations are included within the scope of the invention as defined by the following claims.

What is claimed is:

1. An inverter circuit including an inverter driving circuit and a plurality of pairs of switching elements coupled in series with each other, each pair of switching elements being coupled to a DC power source in parallel to each other for converting a direct current to an alternating current, said inverter driving circuit comprising:
    a first gate driving circuit and a second gate driving circuit, wherein said first gate driving circuit is different from said second gate driving circuit;
    said first gate driving circuit including a pulse transformer coupled to a first switching element of each pair of switching elements, said first switching element being coupled to one side of said DC power source;
    said second gate driving circuit including a non-induction control device coupled to a second switching element of each pair of switching elements, said second switching element being coupled to the other side of said DC power source; and
    a switching control circuit generating control signals for said first and second gate driving circuits.

2. The inverter circuit of claim 1 wherein said second gate driving circuit comprises a photocoupler and a plurality of transistors for controlling a gate driving signal for said second switching element.

3. The inverter circuit of claim 1 wherein said second gate driving circuit comprises a plurality of transistors for controlling a gate driving signal for said second switching element.

4. An inverter circuit of claim 1 further comprising output terminals for a three-phase load.

5. An inverter circuit including an inverter driving circuit and a plurality of pairs of switching elements coupled in series with each other, each pair of switching elements being coupled to a DC power source in parallel to each other for converting a direct current to an alternating current, said inverter driving circuit comprising:
    a first gate driving circuit and a second gate driving circuit, wherein said first gate driving circuit is different from said second gate driving circuit;
    said first gate driving circuit including a pulse transformer coupled to a first switching element of each pair of switching elements, said first switching element being coupled to one side of said DC power source;
    said second gate driving circuit including a non-induction control device coupled to a second switching element of each pair of switching elements, said second switching element being coupled to the other side of said DC power source;
    a switching control circuit generating control signals for said first and second gate driving circuits; and
    a chopping circuit coupled only between said second gate driving circuit and said switching control circuit for chopping said control signal generated by said switching control circuit for said second gate driving circuit.

6. The inverter circuit of claim 5 wherein said second gate driving circuit comprises a photocoupler and a plurality of transistors for controlling a gate driving signal for said second switching element.

7. The inverter circuit of claim 5 wherein said second gate driving circuit comprises a plurality of transistors for controlling a gate driving signal for said second switching element.

8. The inverter circuit of claim 5 wherein said chopping circuit comprises a pulse generator generating a triangular waveform.

9. An inverter circuit of claim 5 further comprising output terminals for a three-phase load.

10. The inverter circuit of claim 9 wherein said three-phase load is a motor.

* * * * *